United States Patent [19]

Ross

[11] Patent Number: 4,481,061
[45] Date of Patent: Nov. 6, 1984

[54] ETCHING DEPTH MONITOR

[75] Inventor: Alexander Ross, Ayr, Scotland

[73] Assignee: Burroughs Corporation, Detroit, Mich.

[21] Appl. No.: 490,013

[22] Filed: Jun. 10, 1983

Related U.S. Application Data

[62] Division of Ser. No. 327,540, Dec. 4, 1981, abandoned.

[30] Foreign Application Priority Data

Dec. 5, 1980 [GB] United Kingdom ............... 8039048

[51] Int. Cl.³ .......................... C23F 1/02; B44C 1/22; C03C 15/00; C03C 25/06
[52] U.S. Cl. ..................................... 156/345; 156/627
[58] Field of Search ................... 156/345, 627; 324/92, 324/76 R; 73/53, 61 R

[56] References Cited

U.S. PATENT DOCUMENTS 3,808,067 4/1974 Brown ............................ 156/345 X
4,060,097 11/1977 Oxford ........................... 156/345 X Primary Examiner—William A. Powell
Attorney, Agent, or Firm—Kevin R. Peterson; Edmund M. Chung; David G. Rasmussen

[57] ABSTRACT

A monitor (9) for determining the amount of metal which has been removed during the course of a chemical etching process comprises an etch resistant substrate (10) whereon are affixed a plurality of metal foil areas (12A to 12H) each with its own, known substantially uniform thickness prior to the start of the etching process, indication of the progressive depth of etching being provided by which out of the plurality of areas of foil (12A to 12H) remain at any particular time after the commencement of etching.

15 Claims, 4 Drawing Figures

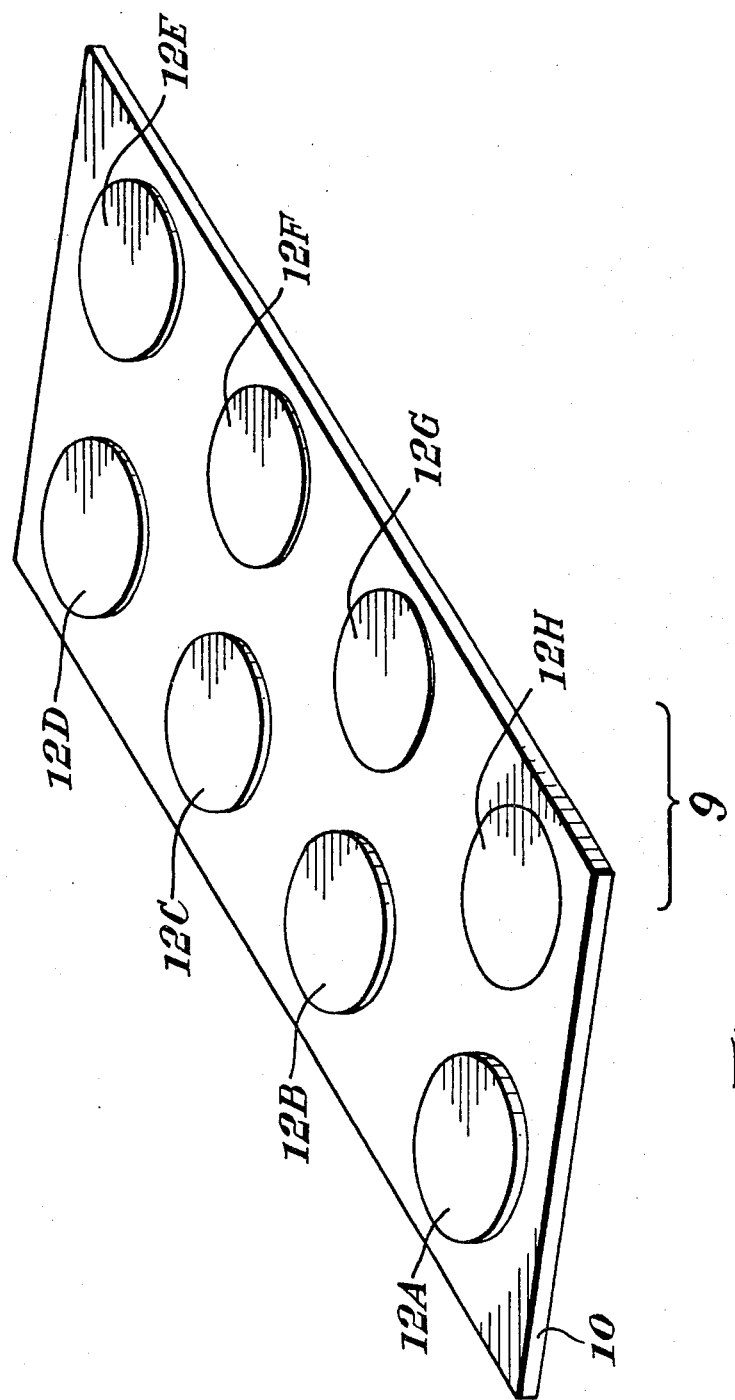

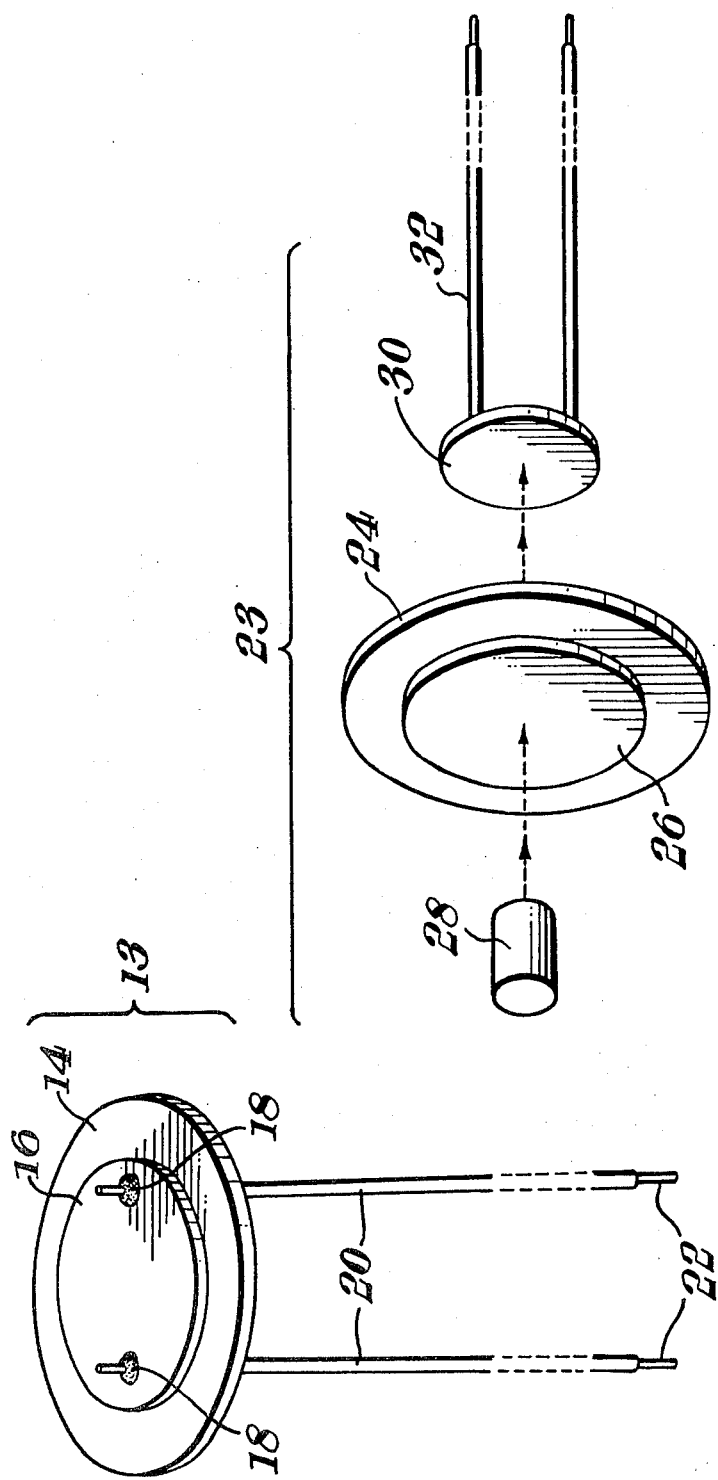

ETCHING DEPTH MONITOR

The present invention relates to a monitor for indicating the amount of metal which is removed by a chemical etching process and to a method for controlling the process.

Chemical etching is extensively employed for the fabrication of printed circuit boards and increasingly employed in the manufacture of other metallic forms such as excised laminae. It is usual to mask those areas which are not to be etched with an etch resistant coating and thereafter to immerse the article in a chemical solution for removing metal from the unprotected areas. The rate of metal removal is a function of solution strength and temperature, and also varies with the nature and history of the metal which is to be removed.

In the manufacture of printed circuit boards, where a copper cladding is etched away from a non-conductive, non-etchable substrate to which it is attached to leave a pattern of conductors, it is important to control the amount of metal which is removed. Those areas which are protected from being etched are in fact undercut from their sides. As the unprotected areas are etched, so the sides of the protected areas are exposed to the etching solution. The etching solution attacks the protected areas from beneath the etch resistant coating to reduce the dimensions of the areas which remain after the etching process. If etching persists after the unprotected areas are completely removed the cross section of remaining conductive areas can be severly reduced in the worst case to nothing at all. It is therefore important to arrange that a board is etched for a sufficient period to remove all unwanted metal but not long enough to significantly affect the areas of wanted metal.

Whenever a board is to be etched, it is known in advance, by the thickness of the metal cladding on the substrate, how much metal should be removed. The etching process is achieved by immersing the board in an etching bath for an operator controllable time. At the start of a run of boards, a time of immersion is chosen according to the solution strength, the temperature, and operator experience. The action of the etching bath on the board or boards is examined, and the time of immersion adjusted empirically until the required amount of metal is being removed from each board. Those boards used in the initial setting up of the etching process are likely to be unacceptable and constitute expensive scrap. During the course of the day the rate of metal removal can change and produce further scrap boards. The immersion time must then be readjusted producing yet further scrap. The whole operation of the etching process is seen to be costly in resultant scrap materials and in lost production time. It is therefore desirable to provide a method and apparatus for establishing the amount of etching bath immersion time for removing a predetermined depth of metal.

According to a first aspect the present invention consists in a monitor for providing indication of the depth of metal removed in any given period of time by a chemical etching process, said monitor comprising a plurality of etchable metal areas on an etch resistant substrate, each of said areas having its own, known, substantially uniform initial thickness, said indication of said depth of etching being provided by which out of said plurality of areas remain at the end of said period.

According to another aspect the present invention consists in a method for chemically etching metal including the use of a monitor for providing indication of the depth of metal removed in any given period of time by a chemical etching process, said monitor comprising a plurality of etchable metal areas on an etch resistant substrate, each of said areas having its own, known, substantially uniform initial thickness, said indication of said depth of etching being provided by which out of said plurality of areas remain at the end of said period.

According to another aspect the present invention consists in a method for controlling a chemical etching process including the use of a monitor for providing indication of the depth of metal removed in any given period of time by said process, said monitor comprising a plurality of etchable metal areas on an etch resistant substrate, each of said areas having its own, known, substantially uniform initial thickness, said indication of said depth of etching being provided by which out of said plurality of areas remain at the end of said period.

According to another aspect the present invention consists in a method for etching a predetermined depth of metal in a chemical etching process, said method including the use of a monitor comprising an etchable metal area on an etch resistant substrate, said area having a known, substantially uniform initial thickness, said method also including measuring the time for said area to be etched away, and applying said process for a selectable proportion of said measured time.

In a first preferred embodiment a monitor preferably comprises a plurality of metal foil areas preferably affixed by waterproof adhesive to a planar substrate.

In a second preferred embodiment a monitor comprises a single metal foil on an etch resistant substrate, the completion of the area having been etched away being indicated by a loss of electrical continuity between two points on the foil.

In a third preferred embodiment a monitor comprises a single metal foil area on a transparent etch resistant substrate, the area being etched away being indicated by the passage of light from a light source through the substrate by a photodetector.

In a fourth preferred embodiment an automatic etching process controller comprises a first timer for measuring the time required to etch away a known thickness of foil from a monitor and a second timer for controlling the amount of time a subject is subjected to said process as a selectable proportion or multiple of said measured time.

The invention is further explained, by way of an example, by the following description in conjunction with the appended drawings, in which:

FIG. 1 shows the monitor of the first preferred embodiment.

FIG. 2 shows the monitor of the second preferred embodiment.

FIG. 3 shows the monitor of the third preferred embodiment.

FIG. 1 shows the etching depth monitor which is the first preferred embodiment of the present invention.

Figure 4:
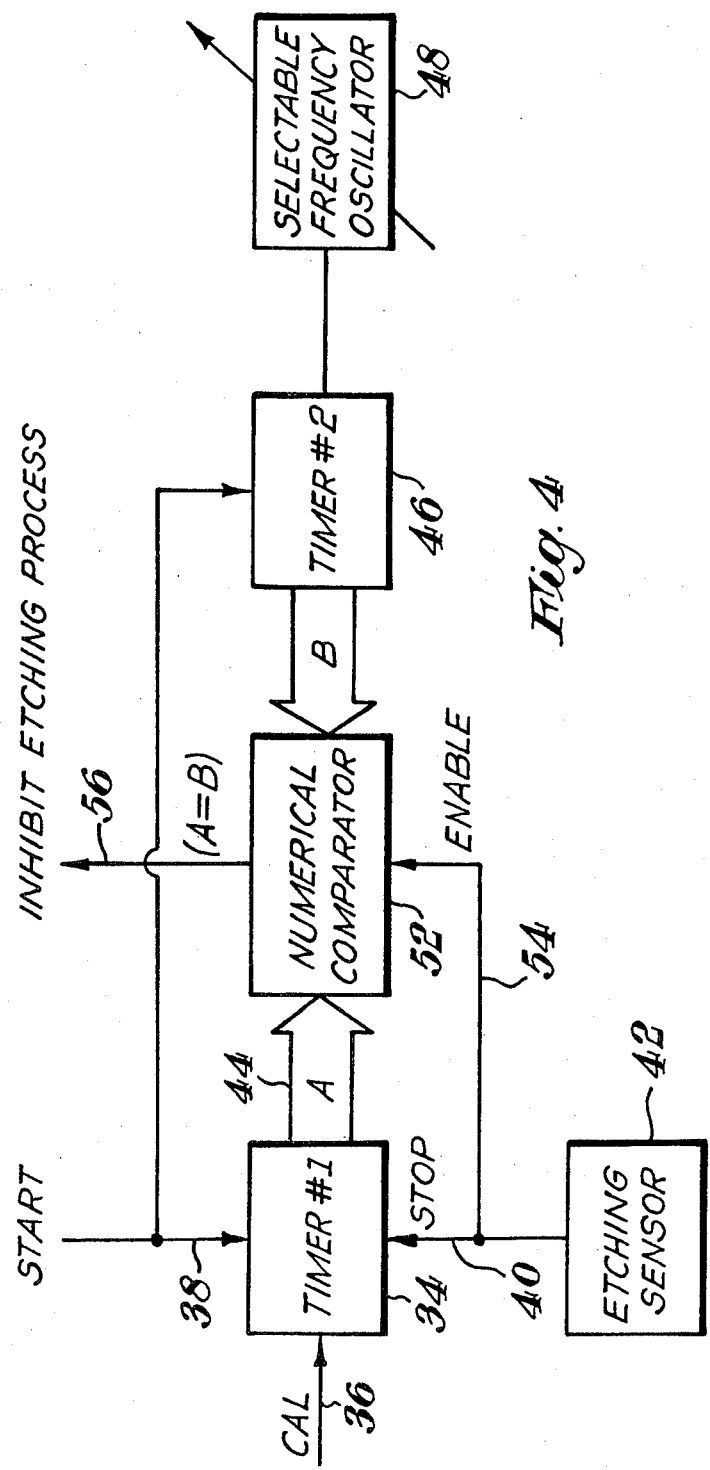
FIG. 4 shows the etching process control system of the fourth preferred embodiment.

An etching depth monitor 9 comprises a planar, glass fibre laminate substrate 10 whereon are affixed eight areas of copper foil 12A to 12H. The thickness of the substrate 10 is not important and its material can be any other substance which is resistant to the chemical etching process with which the monitor 9 is to be used.

Each of the areas 12A to 12H is punched from its own sheet of foil and has its own known uniform thickness.

The area of greatest thickness 12A is, in this example, 40 thou (0.102 cm) thick. The areas 12B to 12H decrease in thickness by 5 thou (0.0127 cm) for each increase in alphabetic postscript so that the area of least thickness 12H is 5 thou (0.0127 cm) thick. The eight areas 12A to 12H thus cover the range from 40 thou to 5 thou (0.102 cm to 0.0127 cm) by 5 thou (0.0127 cm) steps.

The areas 12A to 12H are affixed to the substrate 10 by any adhesive that resists the penetration between the areas and the substrate 10 of the etching solution used in the process which is to be monitored. The adhesive can be supplied ready applied to the foil from which the individual areas 12A to 12H are punched, so that an area, once punched out can be immediately affixed to the substrate. Alternatively, the substrate itself can be supplied with glue. The areas 12A to 12H are affixed to the substrate 10 in a preferred order of decreasing thickness so that the performance of the etching process, as indicated by the monitor, can be told at a glance. This order can be further emphasised by providing areas on the substrate 10 bearing a thickness indicating legend for association with an area of foil 12A to 12H having that same thickness.

When used, the monitor is subjected to the chemical etching process it is to monitor. At the end of the process the depth of copper that the process has etched away is indicated by only those areas 12A to 12H remaining which have an initial thickness greater than the depth of etching. In the example shown, if the process had etched away less than 5 thou of copper (0.0127 cm) then none of the areas 12A to 12H would have disappeared. If the process had etched away between 5 thou (0.0127 cm) and 10 thou of copper (0.0254 cm) then only the thinnest area 12H would have disappeared. On the other hand, if the process had etched away between 35 thou (0.0889 cm) and 40 thou (0.102 cm) then only the thickest area 12A would remain. The actual depth of etching can thus be assessed to within 5 thou (0.0127 cm).

The range of initial thicknesses can be otherwise chosen for greater measurement precision by reduction of the thickness difference between areas. More or fewer areas than 8 can be used to provide any range that is desired. In particular, when it is known in advance, with some precision, how much copper is removed by the process, then the precision of measurement can be made very great by providing areas whose thicknesses cluster with small differences therebetween about the expected value.

The monitor shown in this example is intended for use in assessing the performance of a printed circuit board etching bath, where the metal on the boards is copper. Since the areas 12A to 12H are also copper, the amount of their etching away is substantially equal to the amount of etching experienced by a printed circuit board. Dependently upon the exact nature of the etching process, it is possible to arrange that the areas are made of a metal other than that of the ultimate subject of the etching process. The monitor 9 is still of use provided that it is known in what relative ratios the two metals are etched.

The monitor 9 can be employed in two ways for the control of the etching of printed circuit boards. In a first method of control the monitor is subjected to the etching process for a known amount of time. From the depth of etching achieved in that time, the rate of etching of the process is calculated, the amount of time required to etch the depth required to be etched in the manufacture of the printed circuit boards is calculated and the boards subjected to the process for that length of time. The process is monitored periodically during the manufacture of the boards to assure that its rate of etching remains constant. If the rate changes, the etching time for the boards is adjusted accordingly.

A second method of control is more direct. A monitor 9 is subjected to the etching process simultaneously with a batch of boards. The monitor 9 is inspected periodically until it provides indication that the depth of etching so far achieved is equal to that required for the processing of the board. The boards are then removed from the etching process. Subsequent batches of boards are each provided with their own, new monitor.

FIG. 2 shows the second preferred embodiment of the present invention, being an etching depth sensor for use in controlling an etching process.

The sensor 13 comprises a circular, planar substrate 14 whereon a foil pad 16 is affixed such that, if the sensor 13 is subjected to a chemical etching process, the boundary being the common surface between the pad 16 and the substrate is not etched. The fixing of the pad 16 to the substrate 14 can be achieved using adhesives as described for the first preferred embodiment.

The pad 16 and the substrate 14 are each pierced by a pair of holes 18. A pair of insulated wires 20 pass through the holes 18 and have their first ends stripped and soldered to the pad. The wires 20 pass to a point remote from the sensor, which, when the sensor 13 is in use, is also remote from the etching process. The resistance between the remote ends of the wires 20 is measured. The sensor 13 is subjected to an etching process. When the pad 16 is etched away, that is, when the depth of etching is equal to the thickness of the foil from which the pad 16 was made, then the resistance between the ends 22 of the wires 20 changes from the extremely low value provided by metallic interconnection to the relatively high value provided by interconnection through the chemical bath used for the etching process. The change in resistance can be used, if the initial thickness of the pad is equal to the amount of copper it is desired to remove from the printed circuit boards during the course of their manufacture and if the sensor is subjected to the etching process at the same time as the boards, to trigger a sensor which in turn inhibits further etching of the boards for example, by switching on a hoist or conveyor of some kind to physically remove the boards from the etching apparatus.

The change in resistance can also be used, in conjunction with a timer started at the commencement of the etching process, to establish automatically, by stopping the timer when the resistance change occurs, how long the process takes to etch away a depth of metal equal to the thickness of the pad 16, and thereby establish the rate of etching for use in controlling a detph of etching other than the thickness of the pad 16.

FIG. 3 shows, as the third preferred embodiment, an optical sensor for measuring the performance of an etching process.

The optical sensor 23 comprises an optically transparent or translucent substrate 24 with a foil disc 26 affixed thereto. A light source 28 generates light which, but for the presence of the disc 26, would pass through the substrate 24 to be detected by a photosensor 30. The disc is affixed to the substrate 24 in the same manner as the pad 16 is affixed to the substrate 14 of the second preferred embodiment. The disc 26 is etched away as is the pad 16 of the second preferred embodiment and its disappearance, as indicated by the detection of light by the photosensor 30, can be used in the same etching process controlling manner as is the resistance change in the second preferred embodiment. During the etching process the sensor 23 is immersed in the etching bath, with or without printed circuit boards as explained earlier, and the light 28 and the photosensor 30 are housed in any etching solution proof, light transmitting housing or housings, the light path being through part of the chemical solution used in the etching process. In the case of very murky or dispersive solutions, the intensity of the light source 28 can be made very great to operate the photocell 30, which incidentally is protected by the solution from extraneous light, despite the attenuation encountered in the light path.

As a refinement to the sensor 23, a second photocell, not obscured by the disc 26 can be included for controlling the intensity of the light source 28, as seen through a predetermined depth of etching solution, to be substantially a predetermined level irrespectively of the opacity of the solution.

FIG. 4 shows an etching process control system for use in conjunction with the sensors 13, 23 of the second and third preferred embodiments.

A reference timer 34 operates by counting clock pulses at a predetermined fixed frequency. The reference timer 34 is enabled to count whenever the signal on a calibrate line 36 is logically true. The count is started when the signal on a start line 38 becomes logically true, the count beginning at zero and being incremented by one for every clock pulse at the predetermined frequency. The count is stopped and frozen by the signal on the stop line 40 becoming logically true in response to an etching depth sensor 42, such as that of the second or third preferred embodiments, indicating, that its foil area has been etched through. The reference counter 34 provides its count as a plural parallel digit binary number on the reference bus 44.

A control timer 46 is substantially identical to the reference timer 34 with the exceptions that it is not provided with a calibration input and instead of counting clock pulses at a predetermined, fixed frequency it counts clock pulses of a selectable frequency provided by an oscillator 48. The output of the control timer 46 is provided as a plural binary digit number on the control bus 50.

The reference bus 44 is provided as a first input to a numerical comparator 52 and the control bus 50 is provided as a second input thereto. The comparator 52 provides a logically true output on the match line 56 whenever the number on the control bus 50 is equal to or greater than the number on the reference bus 44 and when the signal on an enabling line 54 is also logically true.

The enabling line 54 is coupled to the output of the etching sensor 42. The match line 56 is coupled to an inhibitor for the etching process. The control timer 46 is started from a zero count which is increased by one for every clock pulse from the oscillator, 48 when the signal on the start line 38 becomes logically true.

In use a fresh sensor 42 is provided each time the etching process is to be calibrated. The signal on the calibration line 36 is made logically true and the signal on the start line 38 is subsequently made logically true whenever the etching process commences. The reference timer 34 is thus started in its count from zero by the commencement of the etching process.

The manner in which the etching process is started and stopped can be, for example, by the lowering into and raising from an etching bath of the items to be etched. Similarly, the items to be etched can be inserted into an empty bath and the process started and stopped by the filling of the bath with etching solution whenever the process is to take place and the draining or pumping of the solution out of the bath whenever the process is not to proceed. The logically true signal on the start line 38 indicative of the commencement of etching can be provided manually by means of a process operator usable switch, or by some automatic sensor to provide indication that the items to be etched have been lowered into the bath, or that the bath has been filled with etching solution, or of some similar physical event associated with the onset of etching. Similarly, the logically true calibrate signal on the calibrate line 36 can be provided by a process operator usable switch, or by any sensor for detecting that a new etching sensor 42 is now in use. The calibrate signal on the calibrate line 36 is reset to be logically false whenever the etching sensor 42 indicates the completion of the etching away of its metal foil area. An automatic calibration signal generator includes a flip-flop which is set whenever a new etching sensor 42 is provided and reset whenever that etching sensor 42 indicates the etching away of its foil. Alternatively the resetting can be done manually.

The reference counter 34 maintains its incremental count until the etching sensor 42 indicates that its foil has been etched through. The reference timer then has its count frozen as an output on the reference bus 44. This output is maintained until such time as the reference counter 34 is put through another calibration process.

With the termination of the reference count by the indication of the etching sensor 42 the numerical comparator 52 is also enabled to provide indication of numerical equality or superiority of the binary number on the control bus 50 over the reference count.

The frequency of the oscillator 48 is chosen to be less than the predetermined frequency used to increment the reference timer 34 by a ratio equal to depth of etching required to be performed in the manufacture of the printed circuit boards divided by the thickness of the foil area which is etched away in the etching sensor 42. For example, if the foil in the sensor 42 is 10 thou (0.0254 cm) thick, and it is desired to etch 25 thou (0.0635 cm) from the printed circuit boards, then the frequency of the oscillator 48 is chosen to be 1/2.5 of the frequency used for the reference counter 34.

The oscillator 48 can be a continuously, manually variable oscillator provided with a dial calibrated in the depth of etching required to be performed in the manufacture of the printed circuit boards for one or more thicknesses of foil in the etching sensor 42. Alternatively, the clocking signal for both the reference timer 34 and the control timer can be derived from a common source and dividing circuitry provided whereby the signals supplied to the control timer 46 are an externally selectable sub-multiple of the signals provided to the reference timer 34.

A fresh sensor 42 can be provided in association with each set of boards to be processed, in which case the reference timer 34 is operated for every bath of boards, and the depth of etching is controlled in a continuous manner such that the etching time for the boards is varied in sympathy with the etching rate of the process. The reference timer 34 and the control timer 46 are simultaneously started by the signal on the start line 38, the reference timer 34 stopping when the sensor 42 has its foil etched away and the control timer 46 continuing in its count until it equals the stopped count of the reference timer 34. The numerical comparator 52 then provides output on the match line 56 which inhibits the etching process by starting apparatus to remove the boards from the etching bath, or drain the etching bath, or perform any similar operation which halts the etching process.

Rather than provide a fresh sensor 42 with each batch of boards to be processed, the control system can be used to calibrate the etching process. A sensor 42 is etched. The frozen output of the reference timer 34 remains on the reference bus 44 for as long as is desired thereafter. The frequency of the oscillator 46 is set appropriately for etching the subsequent batches of printed circuit boards. As many batches of printed circuit boards can be run through the etching process thereafter as is desired, without any of the batches being accompanied by a fresh sensor. In this manner of operation the frequency of the oscillator 46 can be set either higher or lower than the fixed frequency used to increment the reference timer 34. The controller can therefore be set to etch the batches of boards for a fraction of the period it requires to etch away the foil on the sensor 42. The manual or automatic means of adjusting this higher frequency are the same as and subject to the same restraints as the means for setting the lower frequency of the first method of operation.

It is to be appreciated that the sensor 42 of FIG. 4 need not necessarily be of the type shown as the second and third preferred embodiments of the invention. The sensor 42 might equally well be a scrap offcut of copper clad board between two crocodile clips or the like the resistance between the clips being measured and assessed in the same manner as is the resistance in the second preferred embodiment of FIG. 2. The foil of the sensor 42 need not be backed by a substrate, but can be subjected to the etching process from both sides simultaneously in which case its equivalent etching depth must be taken as half of its thickness. The etching process herein described with reference to the manufacture of printed circuit boards can equally well be for the formation of any other item where metal is required to be chemically etched. The time of exposure to the etching process can be controlled by controlling the speed of a board-carrying conveyor through an etching bath.

What I claim is:

1. A controller for controlling a chemical etching process, said controller comprising:
    a first timer, having a start input for starting at the commencement of a test etching process and having a stop input for stopping at the termination of said test etching to measure and provide an output indicative of the amount of time required to etch through a predetermined thickness of metal;
    a second timer, having a start input for starting at the commencement of a main etching process to measure and provide an output indicative of the amount of time that said main etching process has been in progress;
    a comparator, coupled to receive and compare said outputs of said first and second timers to terminate said main etching process whenever said amount of time measured by said second timer is in a predetermined, selectable ratio to said amount of time measured by said first timer, said ratio being the proportion of said depth of metal to be etched and said predetermined thickness of metal;
    whereby said main etching process is controllable to etch a depth of metal in the same proportion to said predetermined thickness as said ratio.

2. A controller according to claim 1 wherein said first timer comprises a first clock source having a first, predetermined, fixed frequency and further comprises a first counter for counting the number of clock pulses from said first clock source during said test etching process, said count of said first counter being provided as the output of said first timer, wherein said second timer comprises a second clock source having a second, selectable frequency and further comprises a second counter for counting the number of clock pulses from said second clock source during said main etching process, said count of said second counter being provided as the output of said second timer, wherein said comparator is operable to terminate said main etching process whenever said count of said second counter achieves equality with said count of said first counter, and wherein said first frequency is in said ratio to said second, selectable frequency.

3. A controller according to claim 2 wherein said test etching process commences simultaneously with the commencement of said main etching process and wherein said second frequency is lower than said first frequency.

4. A controller according to claim 3 further comprising an etching depth monitor having an etchable metal area of said predetermined thickness on an etch resistant substrate and further having a detector for providing an output signal indicative of the etching through of said metal area, wherein said first counter is operable to have its count initialized at the commencement of said test etching process, and wherein said first counter is coupled to receive said output signal from said detector and is operable to freeze its count in response to the reception thereof.

5. A controller according to claim 4 wherein said detector comprises means for measuring the electrical resistance between first and second points on said metal area and is operable to provide said output signal whenever said resistance exceeds a predetermined value.

6. A controller according to claim 5 wherein said first point has a first etch-solution isolated electrical conductor electrically coupled thereto, wherein said second point has a second etch-solution isolated electrical conductor coupled thereto, and wherein said first and second conductors are coupled to said means for measuring electrical resistance for measuring the electrical resistance therebetween.

7. A controller according to claim 4 wherein said substrate is light-transmissive and wherein said detector comprises a light source for illuminating a first side of said metal area and a photosensor for detecting light on a second side of said metal area, said photosensor providing said output signal of said monitor whenever the amount of light reaching said photosensor exceeds a predetermined level.

8. A controller according to claim 7 wherein said monitor includes a light level detector disposed in proximity to said photosensor, in receipt of light from said light source which has not passed through said substrate and operable to provide a feedback signal to adjust the intensity of said lightsource for the intensity of light detected by said light level detector to be maintained at a substantially constant level.

9. A controller according to claim 2 wherein said test etching process is performed in isolation, and wherein, in said main etching process, performed thereafter, said second frequency can be higher than or lower than said first frequency.

10. A controller according to claim 9 wherein the count of said first counter, established in said test etching process performed in isolation, is maintained, without repetition of said test etching process, throughout a plural succession of performances of said main etching process.

11. A controller according to claim 10 wherein said first timer further comprises an etching depth monitor having an etchable metal resistant substrate and further having a detector for providing an output signal indicative of the etching through of said metal area, wherein said first counter is operable to have its count initialized at the commencement of said test etching process, and wherein said first counter is coupled to receive said output signal from said detector and is operable to freeze its count in response to the reception thereof.

12. A controller according to claim 10 wherein said detector comprises means for measuring the electrical resistance between first and second points on said metal area and is operable to provide said output signal whenever said resistance exceeds a predetermined value.

13. A controller according to claim 12 wherein said first point has a first etch-solution isolated electrical conductor electrically coupled thereto, wherein said second point has a second etch-solution isolated electrical conductor coupled thereto, and wherein said first and second conductors are coupled to said means for measuring electrical resistance for measuring the electrical resistance therebetween.

14. A controller according to claim 11 wherein said substrate is light-transmissive and wherein said detector comprises a light source for illuminating a first side of said metal area and a photosensor for detecting light on a second side of said metal area, said photosensor providing said output signal of said monitor whenever the amount of light reaching said photosensor exceeds a predetermined level.

15. A controller according to claim 14 wherein said monitor includes a light level detector disposed in proximity to said photosensor, in receipt of light from said light source which has not passed through said substrate and operable to provide a feedback signal to adjust the intensity of said light source for the intensity of light detected by said light level detector to be maintained at a substantially constant level.

* * * * *